(12) United States Patent
Ramanathan et al.

(10) Patent No.: US 6,821,909 B2
(45) Date of Patent: Nov. 23, 2004

(54) POST RINSE TO IMPROVE SELECTIVE DEPOSITION OF ELECTROLESS COBALT ON COPPER FOR ULSI APPLICATION

(75) Inventors: Sivakami Ramanathan, Fremont, CA (US); Deenesh Padhi, Santa Clara, CA (US); Srinivas Gandikota, Santa Clara, CA (US); Girish A. Dixit, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 10/284,855

(22) Filed: Oct. 30, 2002

(65) Prior Publication Data

US 2004/0087141 A1 May 6, 2004

(51) Int. Cl.$^7$ ............................................... H01L 21/31
(52) U.S. Cl. ..................... 438/758; 438/678; 438/759
(58) Field of Search ........................ 438/758, 678, 438/674, 687, 913, 759, 906, 682, 754, 755, 655, 656, 666, 685; 427/123, 125, 601, 304, 305, 347, 437, 535, 253

(56) References Cited

U.S. PATENT DOCUMENTS

| | | |
|---|---|---|
| 2,369,620 A | 2/1945 | Sullivan et al. ............. 117/130 |
| 3,937,857 A | 2/1976 | Brummett et al. ............ 427/98 |
| 4,006,047 A | 2/1977 | Brummett et al. .......... 156/656 |
| 4,232,060 A | 11/1980 | Mallory et al. .............. 427/98 |
| 4,234,628 A | 11/1980 | DuRose ...................... 427/305 |
| 4,265,943 A | 5/1981 | Goldstein et al. ........... 427/305 |
| 4,364,803 A | 12/1982 | Nidola et al. ................. 204/30 |
| 4,368,223 A | 1/1983 | Kobayashi et al. ...... 427/443.1 |
| 4,397,812 A | 8/1983 | Mallory et al. ............. 420/441 |
| 4,632,857 A | 12/1986 | Mallory, Jr. ................. 428/209 |

(List continued on next page.)

FOREIGN PATENT DOCUMENTS

| | | | |
|---|---|---|---|
| EP | 0 329 406 | 8/1989 | ........... C23C/28/02 |
| EP | 0 475 567 | 3/1992 | ............ H05K/1/09 |
| EP | 0 913 498 | 5/1999 | ........... C23C/18/16 |
| GB | 2285174 | 6/1995 | ........... H01L/23/52 |
| JP | 7-297543 | 11/1995 | ............ H05K/3/38 |
| JP | 11-124682 | 5/1999 | ........... C23C/18/31 |

OTHER PUBLICATIONS

Yosi Shacham–Diamond, et al. "High Aspect Ratio Quarter–Micron Electroless Copper Integrated Technology", Microelectronic Engineering 37/38 (1997) pp. 77–88.

(List continued on next page.)

*Primary Examiner*—Carl Whitehead, Jr.
*Assistant Examiner*—Laura M Schillinger
(74) *Attorney, Agent, or Firm*—Moser, Patterson & Sheridan

(57) ABSTRACT

A method for depositing a passivation layer on a substrate surface using one or more electroplating techniques is provided. Embodiments of the method include selectively depositing an initiation layer on a conductive material by exposing the substrate surface to a first electroless solution, depositing a passivating material on the initiation layer by exposing the initiation layer to a second electroless solution, and cleaning the substrate surface with an acidic solution. In another aspect, the method includes applying ultrasonic or megasonic energy to the substrate surface during the application of the acidic solution. In still another aspect, the method includes using the acidic solution to remove between about 100 Å and about 200 Å of the passivating material. In yet another aspect, the method includes cleaning the substrate surface with a first acidic solution prior to the deposition of the initiation layer.

22 Claims, 4 Drawing Sheets

U.S. PATENT DOCUMENTS

| | | | |
|---|---|---|---|
| 4,810,520 A | 3/1989 | Wu | 427/8 |
| 5,147,692 A | 9/1992 | Bengston | 427/438 |
| 5,203,911 A | 4/1993 | Sricharoenchaikit et al. | 106/1.26 |
| 5,235,139 A | 8/1993 | Bengston et al. | 174/257 |
| 5,240,497 A | 8/1993 | Shacham et al. | 106/1.26 |
| 5,248,527 A | 9/1993 | Uchida et al. | 427/437 |
| 5,380,560 A | 1/1995 | Kaja et al. | 427/306 |
| 5,384,284 A | 1/1995 | Doan et al. | 437/190 |
| 5,415,890 A | 5/1995 | Kloiber et al. | 427/242 |
| 5,478,462 A | 12/1995 | Walsh | 205/169 |
| 5,510,216 A | 4/1996 | Calabrese et al. | 430/16 |
| 5,648,125 A | 7/1997 | Cane | 427/534 |
| 5,674,787 A | 10/1997 | Zhao et al. | 437/230 |
| 5,695,810 A | 12/1997 | Dubin et al. | 427/96 |
| 5,733,816 A | 3/1998 | Iyer et al. | 438/592 |
| 5,824,599 A | 10/1998 | Schacham-Diamand et al. | 438/678 |
| 5,843,538 A | 12/1998 | Ehrsam et al. | 427/601 |
| 5,846,598 A | 12/1998 | Semkow et al. | 427/98 |
| 5,885,749 A | 3/1999 | Huggins et al. | 430/312 |
| 5,891,513 A | 4/1999 | Dubin et al. | 427/98 |
| 5,904,827 A | 5/1999 | Reynolds | 205/68 |
| 5,907,790 A | 5/1999 | Kellam | 438/666 |
| 5,910,340 A | 6/1999 | Uchida et al. | 427/437 |
| 5,913,147 A | 6/1999 | Dubin et al. | 438/687 |
| 5,932,077 A | 8/1999 | Reynolds | 204/224 R |
| 5,933,757 A * | 8/1999 | Yoshikawa et al. | 438/682 |
| 5,969,422 A | 10/1999 | Ting et al. | 257/762 |
| 6,010,962 A | 1/2000 | Liu et al. | 438/687 |
| 6,015,724 A | 1/2000 | Yamazaki | 438/151 |
| 6,015,747 A | 1/2000 | Lopatin et al. | 438/586 |
| 6,065,424 A | 5/2000 | Shacham-Diamand et al. | 118/696 |
| 6,077,780 A | 6/2000 | Dubin | 438/687 |
| 6,107,199 A | 8/2000 | Allen et al. | 438/685 |
| 6,110,530 A | 8/2000 | Chen et al. | 427/253 |
| 6,113,771 A | 9/2000 | Landau et al. | 205/123 |
| 6,136,163 A | 10/2000 | Cheung et al. | 204/198 |
| 6,136,693 A | 10/2000 | Chan et al. | 438/633 |
| 6,140,234 A | 10/2000 | Uzoh et al. | 438/678 |
| 6,144,099 A | 11/2000 | Lopatin et al. | 257/758 |
| 6,153,935 A | 11/2000 | Edelstein et al. | 257/773 |
| 6,165,912 A * | 12/2000 | McConnell et al. | 438/758 |
| 6,171,661 B1 | 1/2001 | Zheng et al. | 427/535 |
| 6,174,812 B1 | 1/2001 | Hsiung et al. | 438/687 |
| 6,180,523 B1 | 1/2001 | Lee et al. | 438/678 |
| 6,197,181 B1 | 3/2001 | Chen | 205/123 |
| 6,197,364 B1 | 3/2001 | Paunovic et al. | 427/98 |
| 6,197,688 B1 | 3/2001 | Simpson | 438/678 |
| 6,228,233 B1 | 5/2001 | Lakshmikanthan et al. | 204/277 |
| 6,242,349 B1 | 6/2001 | Nogami et al. | 438/687 |
| 6,245,670 B1 | 6/2001 | Cheung et al. | 438/637 |
| 6,251,236 B1 | 6/2001 | Stevens | 204/224 R |
| 6,258,220 B1 | 7/2001 | Dordi et al. | 204/198 |
| 6,258,223 B1 | 7/2001 | Cheung et al. | 204/242 |
| 6,258,270 B1 | 7/2001 | Hilgendorff et al. | 210/321.75 |
| 6,291,348 B1 | 9/2001 | Lopatin et al. | 438/687 |
| 6,319,387 B1 | 11/2001 | Krishnamoorthy et al. | 205/240 |
| 6,323,128 B1 | 11/2001 | Sambucetti et al. | 438/678 |
| 6,342,733 B1 | 1/2002 | Hu et al. | 257/750 |
| 6,344,410 B1 | 2/2002 | Lopatin et al. | 438/652 |
| 6,416,647 B1 | 7/2002 | Dordi et al. | 205/137 |
| 6,432,819 B1 | 8/2002 | Pavate et al. | 438/676 |
| 6,436,267 B1 | 8/2002 | Carl et al. | 205/186 |
| 6,441,492 B1 | 8/2002 | Cunningham | 257/762 |
| 6,516,815 B1 | 2/2003 | Stevens et al. | 134/25.4 |
| 6,528,409 B1 | 3/2003 | Lopatin et al. | 438/618 |
| 6,565,729 B2 | 5/2003 | Chen et al. | 205/82 |
| 6,573,606 B2 | 6/2003 | Sambucetti et al. | 257/762 |
| 6,605,874 B2 | 8/2003 | Leu et al. | 257/758 |
| 6,616,967 B1 | 9/2003 | Test | 427/98 |
| 2001/0030366 A1 | 10/2001 | Nakano et al. | 257/758 |
| 2002/0036143 A1 | 3/2002 | Segawa et al. | 205/187 |
| 2002/0098681 A1 | 7/2002 | Hu et al. | 438/626 |
| 2003/0010645 A1 | 1/2003 | Ting et al. | 205/170 |
| 2003/0075808 A1 | 4/2003 | Inoue et al. | 257/774 |
| 2003/0116439 A1 | 6/2003 | Seo et al. | 205/125 |
| 2003/0181040 A1 | 9/2003 | Ivanov et al. | 438/687 |

OTHER PUBLICATIONS

C.K. Hu, et al. "Reduced Electromigration of Cu Wires by Surface Coating" Applied Physics Letters, vol. 81, No. 10, Sep. 2, 2002—pp. 1782–1784.

USSN 09/599,125, (Cheung, et al.), filed Jun. 22, 2000.

USSN 09/505,638, (Parke, et al.), filed Feb. 16, 2000.

USSN 09/522,726, (Kalyanam, et al.), filed Mar. 10, 2000.

USSN 09/245,780, (Dordi, et al.), filed Feb. 5, 1999.

Lopatin, et al., "Thin Electroless barrier for copper films", Part of the SPIE Conference of Multilevel Interconnect technology II, SPIE vol. 3508 (1998), pp. 65–77.

Schacham–Diamand, et al. Material properties of electroless 100–200 nm thick CoWP films, Electrochemical Society Proceedings, vol. 99–34, pp. 102–110.

Eze, et al., "Chemical–bath–deposited cobalt sulphide films: preparation effects," Materials Chemistry and Physics, 47 (1997), pp. 31–36.

Shacham–Diamand, et al., "Electrochemically deposited thin film alloys for ULSI and MEMS applications," Microelectronic Engineering 50 (2000), pp. 525–531.

Saito, et al., "Electroless deposition of Ni–B, Co–B and Ni–Co–B alloy using dimethylamineborane as a reducing agent", J. of Appl. Electrochemistry 28 (1998) 559–563.

Eze, F. C., "Electroless deposition of CoO thin films," J. Phys. D: Appl. Phys. 32 (1999), pp. 533–540.

Lin, et al., "Manufacturing of Cu Electroless Nickel/Sn–Pb Flip Chip Solder Bumps", IEEE Transactions on Advanced Packaging, vol. 22, No. 4 (Nov. 1999), pp. 575–579.

Pearlstein, Fred. "Electroless Plating," J. Res. Natl. Bur. Stan., Ch. 31 (1963), pp. 710–747.

* cited by examiner

POST RINSE TO IMPROVE SELECTIVE DEPOSITION OF ELECTROLESS COBALT ON COPPER FOR ULSI APPLICATION

BACKGROUND OF THE INVENTION

1. Field of the Invention

Embodiments of the invention relate to a method for manufacturing integrated circuit devices. More particularly, embodiments of the invention relate to a method for forming metal interconnects.

2. Description of the Related Art

Sub-quarter micron multilevel metallization is one of the key technologies for the next generation of very large scale integration (VLSI). The multilevel interconnects that lie at the heart of this technology possess high aspect ratio features, including contacts, vias, lines, or other apertures. Reliable formation of these features is very important to the success of VLSI and to the continued effort to increase quality and circuit density on individual substrates. Therefore, there is a great amount of ongoing effort being directed to the formation of void-free features having high aspect ratios (height:width) of 4:1 or greater.

The presence of native oxides and other contaminants within a feature causes problems during fabrication. For example, the presence of native oxides and other contaminants within a feature creates voids by promoting uneven distribution of a depositing layer. The presence of native oxides and other contaminants can also reduce the electromigration resistance of vias and small features. Further, the presence of native oxides and other contaminants can diffuse into the dielectric layer, the sublayer, or the depositing layer and alter the performance of the device. Typically, native oxides are formed when a substrate surface having a nonconductive layer (silicon, silicon oxide) or a conductive layer (aluminum, tungsten, titanium, tantalum, tungsten, copper) disposed thereon, is exposed to oxygen in the atmosphere or is damaged in a plasma etch step. The "other contaminants" may be generated from sputtered material from an oxide over-etch, residual photoresist from a stripping process, leftover polymer from a previous oxide etch step, or redeposited material from a preclean sputter etch process, for example.

A typical process for forming an interconnect on a substrate includes depositing one or more layers, etching at least one of the layer(s) to form one or more features, depositing a barrier layer in the feature(s) and depositing one or more layers to fill the feature. Copper and its alloys have become the metals of choice for filling sub-micron interconnect technology because copper has a lower resistivity than aluminum, (1.7 $\mu\Omega$-cm compared to 3.1 $\mu\Omega$-cm for aluminum), a higher current carrying capacity, and a significantly higher electromigration resistance. Copper also has good thermal conductivity and is available in a highly pure state.

However, copper readily forms oxides when exposed to atmospheric conditions. Copper oxides increase the resistance of metal layers, become a source of particle problems, and reduce the reliability of the overall circuit. Copper oxides may also interfere with subsequent deposition processes.

One solution to prevent the formation of copper oxides is to deposit a passivation layer or encapsulation layer over the copper layer. A passivation layer isolates copper surfaces from ambient oxygen. Cobalt and cobalt alloys have been observed as suitable materials for passivating copper and may be deposited on copper by electroless deposition techniques. However, copper does not satisfactorily catalyze or initiate deposition of cobalt and cobalt alloys from electroless solutions.

To counteract this problem, a common approach has been to activate the copper surface by first depositing a catalytic material on the copper surface. The deposition of the catalytic material typically requires multiple, time consuming steps and, most times, the use of catalytic colloid compounds. Catalytic colloid compounds can adhere to dielectric materials and produce undesired, excessive, and non-selective deposition of passivating material on the substrate surface. Non-selective deposition of passivating material, such as deposition on dielectric materials, may lead to surface contamination, unwanted diffusion of conductive materials into dielectric materials, and even device failure from short circuits and other device irregularities.

There is a need, therefore, for a method for selectively depositing a passivation layer on a conductive substrate using one or more electroplating techniques.

SUMMARY OF THE INVENTION

Embodiments of the invention provide a method for depositing a passivation layer on a substrate surface using one or more electroplating techniques. In one aspect, the method includes selectively depositing an initiation layer on a conductive material by exposing the substrate surface to a first electroless solution, depositing a passivating material on the initiation layer by exposing the initiation layer to a second electroless solution, and cleaning the substrate surface with an acidic solution.

In another aspect, the method includes polishing a substrate surface to expose a conductive material disposed in a dielectric material, exposing the substrate surface to a first acidic solution, selectively depositing an initiation layer on the conductive material by exposing the substrate surface to a first electroless solution, electrolessly depositing a passivating material comprising cobalt or a cobalt alloy on the initiation layer, and cleaning the substrate surface with a second acidic solution.

In yet another aspect, the method includes cleaning a substrate surface with a first acidic solution, selectively depositing a noble metal selected from the group of palladium, platinum, alloys thereof, and combinations thereof on the substrate surface by exposing the substrate surface to an acidic electroless solution containing a noble metal salt and an inorganic acid, electrolessly depositing cobalt or a cobalt alloy on the noble metal, cleaning the substrate surface with a second acidic solution, and applying ultrasonic or megasonic energy to the substrate surface while cleaning the substrate surface with the second acidic solution.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
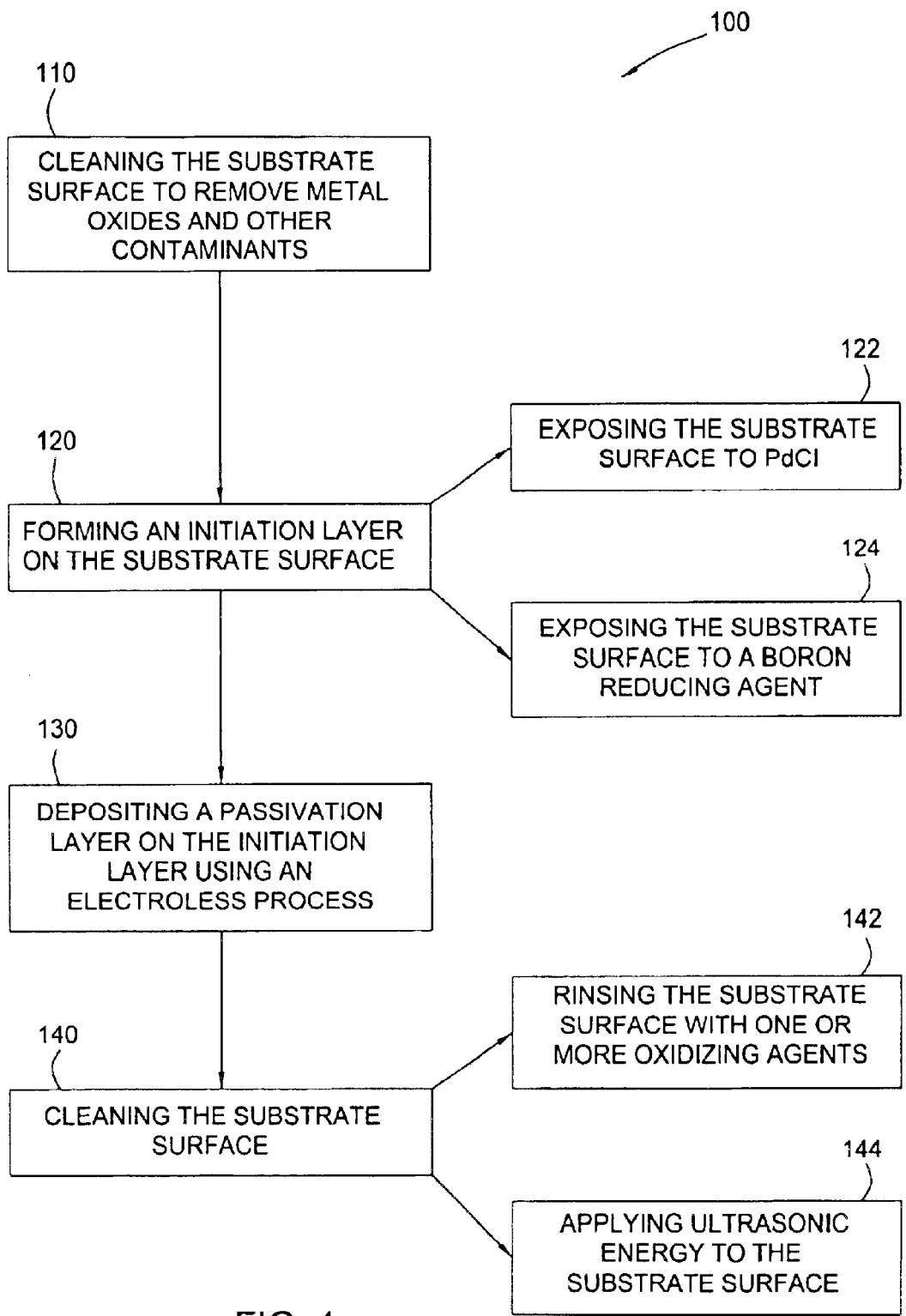
FIG. 1 illustrates an exemplary processing sequence according to embodiments of the invention described herein.

FIG. 1 illustrates an exemplary processing sequence 100 according to embodiments of the invention. In step 110, a substrate surface having one or more conductive materials at least partially formed thereon, such as copper for example, is pre-rinsed/treated to remove metal oxides or other contaminants from the substrate surface. "Substrate surface" as used herein refers to a layer of material that serves as a basis for subsequent processing operations. For example, a substrate surface may contain one or more conductive metals, such as aluminum, copper, tungsten, or combinations thereof, for example, and may form part of an interconnect feature such as a plug, via, contact, line, wire, and may also form part of a metal gate electrode. A substrate surface may also contain one or more nonconductive materials, such as silicon, doped silicon, germanium, gallium arsenide, glass, and sapphire, for example.

The pre-rinse/treatment process utilizes an acidic solution to remove/etch a top portion of the substrate surface, such as between about 10 Å and about 50 Å, which may have contaminating materials from a prior processing step. Such a prior processing step may be a planarizing process, for example. The acidic solution may contain an inorganic acid solution. For example, the acidic solution may contain between about 0.2 weight percent (wt. %) to about 5 wt. % of hydrofluoric acid (HF), such as about 0.5 wt. %. The acidic solution may also contain nitric acid having a concentration between about 1 M and about 5 M. Alternatively, the acidic solution may be a mixture of sulfuric acid having a concentration between about 0.5 percent by volume (vol %) and about 10 vol %, such as between about 1 vol % and about 5 vol %, and hydrogen peroxide having a concentration between about 5 vol % and about 40 vol %, such as about 20 vol %.

The pre-rinse solution is generally applied to the substrate surface at a rate between about 50 ml/min and about 2,000 ml/min, such as between about 700 ml/min and about 900 ml/min. The pre-rinse solution is typically applied for about 5 seconds to about 300 seconds, such as between about 30 seconds and about 60 seconds at a temperature between about 15° C. and about 60° C. The pre-rinse solution may be applied in the same processing chamber or processing cell as any of the subsequent deposition processes.

Optionally, a rinsing agent, such as deionized water for example, is then applied to the substrate surface to remove any remaining pre-rinse solution, any etched materials and particles, and any by-products that may have formed during the pre-rinse (step 110). The rinsing agent is generally applied to the substrate surface at a flow rate between about 50 ml/min and about 2,000 ml/min, such as between about 700 ml/min and about 900 ml/min. The rinsing agent is typically applied for about 5 seconds to about 300 seconds, such as between about 30 seconds and about 60 seconds at a temperature between about 15° C. and about 80° C. The rinsing agent may be applied by a spraying method as well as by any other method used for cleaning a substrate, such as by rinsing in an enclosure containing a cleaning solution or bath.

Following the pre-rinse process (step 110), an initiation layer is deposited on the substrate surface, as shown at step 120. In one aspect, the initiation layer is formed on the substrate surface by selectively depositing a noble metal, such as palladium, on the exposed conductive materials of the substrate surface (step 122). In another aspect, the initiation layer is formed on the substrate surface by exposing/rinsing the substrate surface with one or more boron-based reducing agents (step 124).

The initiation layer may be formed on the conductive portions of the substrate surface by electrolessly depositing one or more noble metals thereon. The electroless solution generally provides for the deposition of a noble metal to a thickness of about 50 Å or less, such as about 10 Å or less. The noble metal may be palladium, platinum, gold, silver, iridium, rhenium, rhodium, ruthenium, osmium, or any combination thereof. Preferably, the noble metal is palladium or platinum.

In one aspect, the initiation layer is deposited from an electroless solution containing at least one noble metal salt and at least one acid (step 122). A concentration of the noble metal salt within the electroless solution should be between about 20 parts per million (ppm) and about 20 grams per liter (g/L), such as between about 80 ppm and about 300 ppm. Exemplary noble metal salts include palladium chloride ($PdCl_2$), palladium sulfate ($PdSO_4$), palladium ammonium chloride, and combinations thereof.

The acid may be one or more inorganic acids, such as hydrochloric acid (HCl), sulfuric acid ($H_2SO_4$), hydrofluoric acid (HF), and combinations thereof, for example. Alternatively, the acid may be one or more organic acids, such as a carboxylic acid, including acetic acid ($CH_3COOH$), for example. A sufficient amount of acid is included to provide an electroless solution having a pH of about 7 or less. Preferably, the pH of the electroless solution is between about 1 and about 3.

In step 122, the electroless solution for forming the initiation layer is generally applied to the substrate surface at a rate between about 50 ml/min and about 2,000 ml/min, such as between about 700 ml/min and about 900 ml/min. The electroless solution is typically applied for about 1 second to about 300 seconds, such as between about 5 seconds and about 60 seconds, at a temperature between about 15° C. and about 80° C.

In another aspect, the initiation layer is formed by rinsing or exposing the substrate surface to a borane-containing composition (step 124). The borane-containing composition forms a metal boride layer selectively on the exposed conductive metals and becomes a catalytic site for subsequent electroless deposition processes. The borane-containing composition contains one or more boron-based reducing agents, such as sodium borohydride, dimethylamine borane (DMAB), trimethylamine borane, and combinations thereof. Any alkali metal borohydrides and alkyl amine boranes may also be used. The borane-containing composition has a boron reducing agent concentration of about 0.25 grams per liter (g/L) to about 6 g/L, such as between about 2 g/L and about 4 g/L. The borane-containing composition may additionally include one or more pH adjusting agents to adjust a pH of the composition to between about 8 and about 13. Suitable pH adjusting agents include potassium hydroxide (KOH), sodium hydroxide (NaOH), ammonium hydroxide, ammonium hydroxide derivatives, such as tetramethyl ammonium hydroxide, and combinations thereof.

In step 124, the underlying conductive material is exposed to the borane-containing composition for about 30 seconds to about 180 seconds at a temperature between about 15° C.

and about 80° C. The borane-containing composition may be applied at a rate between about 50 ml/min and about 2,000 ml/min, such as between about 700 ml/min and about 900 ml/min. In one aspect, the borane-containing composition may include about 4 g/L of dimethylamine borane (DMAB) and a sufficient amount of sodium hydroxide to provide a pH of about 9.

Optionally, a rinsing agent, such as deionized water, for example, is applied to the substrate surface to remove any solution used in forming the initiation layer. The rinsing agent is generally applied to the substrate surface at a rate between about 50 ml/min and about 2,000 ml/min, such as between about 700 ml/min and about 900 ml/min. The rinsing agent is applied for about 5 seconds to about 300 seconds, such as between about 30 seconds and about 60 seconds, at a temperature between about 15° C. and about 80° C. The rinsing agent may be applied by a spraying method as well as by any other method for cleaning a substrate, such as by rinsing in an enclosure containing a cleaning solution or bath.

A passivation layer is next deposited on the exposed initiation layer by a selective electroless deposition process in step 130. Preferably, the passivation layer includes cobalt or a cobalt alloy. For example, useful cobalt alloys include cobalt-tungsten alloys, cobalt-phosphorus alloys, cobalt-tin alloys, cobalt-boron alloys, and ternary alloys, such as cobalt-tungsten-phosphorus and cobalt-tungsten-boron. The passivation layer may also include other metals and metal alloys, such as nickel, tin, titanium, tantalum, tungsten, molybdenum, platinum, iron, niobium, palladium, nickel cobalt alloys, doped cobalt, doped nickel alloys, nickel iron alloys, and combinations thereof. The passivation layer may be deposited to have a thickness of about 500 Å or less, such as between about 300 Å and about 500 Å. The passivation layer isolates and protects an underlying metal layer from exposure to oxygen, for example. Accordingly, the passivation layer prevents the formation of metal oxides.

Cobalt alloys, such as cobalt-tungsten, may be deposited by adding tungstic acid or tungstate salts, such as sodium tungstate, ammonium tungstate, and combinations thereof. Phosphorus for the cobalt-tungsten-phosphorus deposition may be obtained by using phosphorus-containing reducing agents, such as hypophosphite. Cobalt alloys, such as cobalt-tin, may be deposited by adding stannate salts including stannic sulfate, stannic chloride, and combinations thereof. The metals salts may be in the electroless solution at a concentration between about 0.5 g/L and about 30 g/L, such as between about 2.5 g/L and about 25 g/L.

In one aspect, the passivation layer (step 130) is deposited from a metallic electroless solution containing at least one metal salt and at least one reducing agent. Suitable metal salts include chlorides, sulfates, sulfamates, or combinations thereof. One example of a metal salt is cobalt chloride. The metal salt may be in the electroless solution at a concentration between about 0.5 g/L and about 30 g/L, such as between about 2.5 g/L and about 25 g/L.

Suitable reducing agents include sodium hypophosphite, hydrazine, formaldehyde, and combinations thereof. The reducing agents may also include borane-containing reducing agents, such as dimethylamine borane and sodium borohydride. The reducing agents have a concentration between about 1 g/L and about 30 g/L of the electroless solution. For example, hypophosphite may be added to the electroless solution at a concentration between about 15 g/L and about 30 g/L of the electroless composition.

The electroless solution may further include between about 0.01 g/L and about 50 g/L of one or more additives to improve deposition of the metal. Additives may include surfactants (RE 610), complexing agents (carboxylic acids, such as sodium citrate and sodium succinate), pH adjusting agents (sodium hydroxide, potassium hydroxide), stabilizers (thiourea, glycolic acid), and combinations thereof.

The metallic electroless solution is applied to the substrate surface at a rate between about 50 ml/min and about 2,000 ml/min, such as between about 700 ml/min and about 900 ml/min. The metallic electroless solution is applied for about 30 seconds to about 180 seconds, such as between about 60 seconds and about 120 seconds, at a temperature between about 60° C. and about 90° C.

In one aspect, a cobalt electroless composition for forming the passivation layer may include about 20 g/L of cobalt sulfate, about 50 g/L of sodium citrate, about 20 g/L of sodium hypophosphite, and a sufficient amount of potassium hydroxide to provide a pH of between about 9 and about 11. This electroless composition may be applied to the substrate surface for about 120 seconds at a flow rate of about 750 ml/min and at a temperature of about 80° C. In another aspect, a cobalt-tungsten layer may be deposited by the addition of about 10 g/L of sodium tungstate.

Following the passivation layer deposition, the substrate surface may be cleaned to remove unwanted portions of the passivating material (step 140). In one aspect, the substrate surface is rinsed with one or more oxidizing agents (step 142). In another aspect, ultrasonic or megasonic energy is applied to the substrate surface (step 144) during the rinse (step 142) to enhance removal of the unwanted materials.

The post-deposition cleaning solution may include: (1) a solution of nitric acid and deionized water; (2) a mixture of nitric acid and hydrogen peroxide; (3) a mixture of sulfuric acid and hydrogen peroxide; (4) a mixture of hydrochloric acid and hydrogen peroxide; or (5) any combination thereof. The mixture of nitric acid and deionized water has an acid to water ratio between about 1:2 to about 3:1, such as about 1:1. The mixture of nitric acid and hydrogen peroxide has an acid to peroxide ratio between about 1:2 to about 3:1, such as about 2:1. The mixture of sulfuric acid and hydrogen peroxide has an acid to peroxide ratio between about 2:1 to about 4:1, such as about 3:1. The mixture of hydrochloric acid and hydrogen peroxide has an acid to peroxide ratio between about 2:1 to about 4:1, such as about 3:1. Typically, the hydrogen peroxide is an aqueous solution comprising between about 15% to about 40% hydrogen peroxide, such as 30% hydrogen peroxide. Regardless of the specific cleaning composition, the cleaning solution is generally applied to the substrate surface at a rate between about 700 ml/min and about 900 ml/min, at a temperature between about 15° C. and about 35° C., and at a pressure between about 0.5 atm and about 3 atm.

The post-deposition cleaning solutions are believed to clean free cobalt particles, remove cobalt oxide, and remove reaction by-products, such as $Co(OH)_2$ formed during deposition. The cleaning solution is also believed to remove a layer of cobalt material between about 1 Å to about 400 Å in thickness, such as between about 100 Å and about 200 Å, to remove any random growth or lateral growth of cobalt materials on the substrate surface and over the exposed conductive materials. Once cleaned, the substrate can be transferred for additional processing, such as annealing or subsequent deposition processes.

In one aspect, the cleaning step (step 140) may be enhanced using one or more sources of ultrasonic or megasonic energy applied to the substrate support pedestal or substrate surface (step 144). For example, ultrasonic energy may be applied at a power between about 10 Watts and about 250 Watts, such as between about 10 Watts and about 100 Watts to the substrate support pedestal. The ultrasonic energy may have a frequency between about 25 kHz and about 200 kHz, preferably greater than about 40 kHz. The ultrasonic energy may be applied for between about 3 and about 600 seconds, but longer time periods may be used depending upon the application. If two or more sources of ultrasonic energy are used, then simultaneous multiple frequencies may be used.

Figure 2:
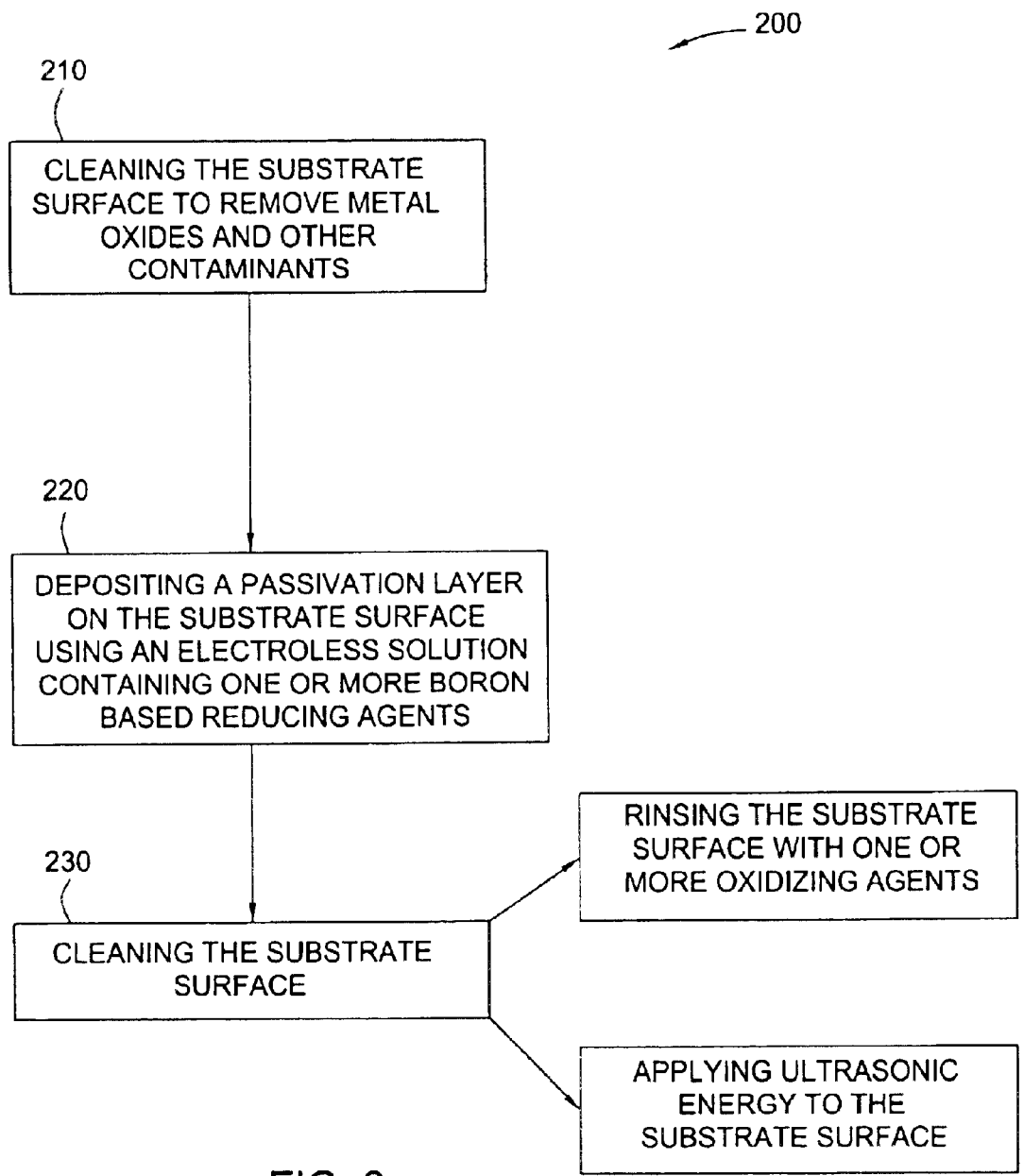
FIG. 2 illustrates an alternative processing sequence according to embodiments of the invention described herein.

FIG. 2 illustrates an alternative processing sequence according to embodiments of the invention described herein. Similar to the process described above with reference to FIG. 1, a substrate surface having one or more conductive materials at least partially formed thereon, such as copper for example, is pre-rinsed/treated to remove metal oxides or other contaminants from the substrate surface, in step 210. Next, a passivation layer is deposited on the substrate surface using an electroless solution containing at least one metal salt and at least one borane-containing reducing agent, in step 220. Finally, the substrate surface is cleaned in step 230, by rinsing with one or more oxidizing agents and/or applying ultrasonic energy during the rinse step.

The pre-rinse step 210 and the post-rinse step 230 are similar to steps 110 and 140, respectively, which have been described above. Step 220 forms a passivation layer on the substrate surface using a mixture of metal salt(s) and borane-reducing agent(s). Suitable metal salts include chlorides, sulfates, sulfamates, or combinations thereof. The metal salt may be in the electroless solution at a concentration between about 0.5 g/L and about 30 g/L, such as between about 2.5 g/L and about 25 g/L. Cobalt alloys, such as cobalt-tungsten may be deposited by adding tungstic acid or tungstate salts, such as sodium tungstate, ammonium tungstate, and combinations thereof. Suitable borane-containing reducing agents include alkali metal borohydrides, such as sodium borohydride, alkyl amine boranes, such as dimethylamine borane (DMAB) and trimethylamine borane, and combinations thereof. The borane-containing reducing agent contains between about 0.25 g/L and about 6 g/L of the boron-containing composition, such as between about 2 g/L and about 4 g/L. The presence of the borane-containing reducing agents allow for the formation of cobalt-boron alloys, such as cobalt-tungsten-boron and cobalt-tin-boron among others.

In one aspect, a cobalt electroless composition for forming the metal layer with a borane-containing reducing agent includes about 20 g/L of cobalt sulfate, about 50 g/L of sodium citrate, about 4 g/L of dimethylamine borane, and a sufficient amount of potassium hydroxide to provide a pH of between about 10 and about 12. This electroless composition may be applied to the substrate surface for about 120 seconds at a flow rate of about 750 ml/min and at a temperature of about 80° C. Optionally, a cobalt-tungsten-boron layer may be deposited by the addition of about 10 g/L of sodium tungstate.

The processing steps described above may be performed in an integrated processing platform, such as the Electra™ ECP processing platform, which is commercially available from Applied Materials, Inc., located in Santa Clara, Calif. The Electra Cu™ ECP platform generally includes one or more electroless deposition processing (EDP) cells, pre-deposition cells, post-deposition cells, such as spin-rinse-dry (SRD) cells, etch chambers, and anneal chambers. The Electra™ ECP processing platform is more fully described in U.S. Pat. No. 6,258,223, issued on Jul. 10, 2001, which is incorporated by reference herein.

Figure 3A:
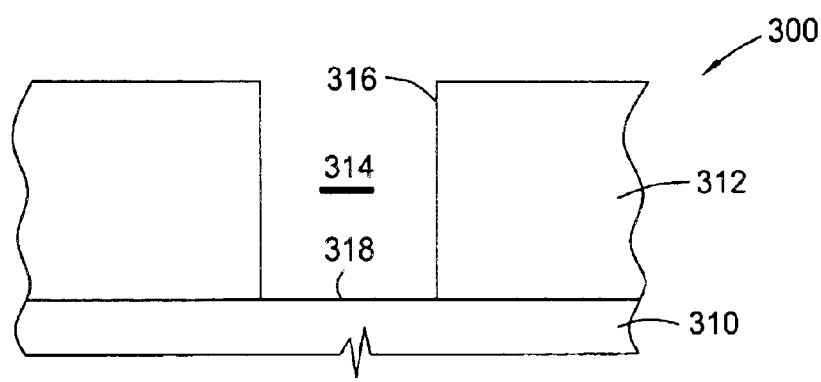
FIGS. 3A–3G are simplified, schematic sectional views of an exemplary wafer at different stages of an interconnect fabrication sequence according to embodiments

FIGS. 3A–3G are schematic representations of an exemplary interconnect structure 300 at different stages of fabrication in accordance with embodiments of the invention described herein. FIG. 3A shows an underlying substrate surface 310 having a dielectric layer 312 formed thereon. The dielectric layer 312 may be any dielectric material including a low k dielectric material (k≦4.0), whether presently known or yet to be discovered. For example, the dielectric layer 312 may be fluorinated silicon glass (FSG), silicon dioxide, silicon carbide, or siloxy carbide deposited using conventional deposition techniques, such as physical vapor deposition and chemical vapor deposition. The dielectric layer 312 is etched to form a feature 314 therein using conventional and well-known techniques. The feature 314 may be a plug, via, contact, line, wire, or any other interconnect component. For simplicity and ease of description, however, the feature 314 will be further described with reference to a via. Typically, the feature 314 has vertical sidewalls 316 and a floor 318, having an aspect ratio of about 4:1 or greater, such as about 6:1. The floor 318 exposes at least a portion of the underlying substrate surface 310. Although not shown, a wire definition may be etched with the via 314 as is commonly known to form a dual damascene structure.

Figure 3B:
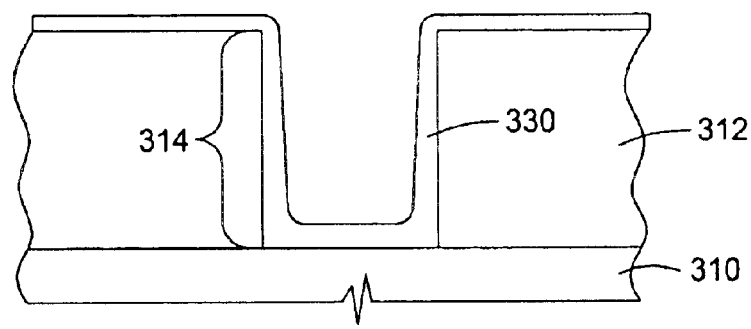

FIG. 3B shows a barrier layer 330 at least partially deposited on the underlying metal layer 310. Prior to depositing the barrier layer 330, the patterned or etched substrate dielectric layer 312 may be cleaned to remove native oxides or other contaminants from the surface thereof. For example, reactive gases are excited into a plasma within a remote plasma source chamber such as a Reactive Pre-clean chamber available from Applied Materials, Inc., located in Santa Clara, Calif. Pre-cleaning may also be done within a metal CVD or PVD chamber by connecting the remote plasma source thereto. Alternatively, metal deposition chambers having gas delivery systems could be modified to deliver the pre-cleaning gas plasma through existing gas inlets such as a gas distribution showerhead positioned above the substrate.

In one aspect, the reactive pre-clean process forms radicals from a plasma of one or more reactive gases, such as argon, helium, hydrogen, nitrogen, fluorine-containing compounds, and combinations thereof. For example, a reactive gas may include a mixture of tetrafluorocarbon ($CF_4$) and oxygen ($O_2$), or a mixture of helium (He) and nitrogen trifluoride ($NF_3$). More preferably, the reactive gas is a mixture of helium and nitrogen trifluoride.

The plasma is typically generated by applying a power of about 500 to 2,000 watts RF at a frequency of about 200 KHz to 114 MHz. The flow of reactive gases ranges between about 100 and about 1,000 sccm and the plasma treatment lasts for about 10 to about 150 seconds. Preferably, the plasma is generated in one or more treatment cycles and purged between cycles. For example, four treatment cycles lasting 35 seconds each is effective.

In another aspect, the patterned or etched dielectric layer 112 may be pre-cleaned first using an argon plasma and then a hydrogen plasma. A processing gas having greater than about 50% argon by number of atoms is introduced at a pressure of about 0.8 mTorr. A plasma is struck to subject the dielectric layer 112 to an argon sputter cleaning environment. The argon plasma is preferably generated by applying between about 50 watts and about 500 watts of RF power. The argon plasma is maintained for between about 10 seconds and about 300 seconds to provide sufficient cleaning time for the deposits that are not readily removed by a reactive hydrogen plasma.

Following the argon plasma, the chamber pressure is increased to about 140 mtorr, and a processing gas consisting essentially of hydrogen and helium is introduced into the processing region. Preferably, the processing gas comprises about 5% hydrogen and about 95% helium. The hydrogen plasma is generated by applying between about 50 watts and about 500 watts power. The hydrogen plasma is maintained for about 10 seconds to about 300 seconds.

The barrier layer 330 is conformally deposited on the floor 318 as well as the side walls 316 of the feature 314 using conventional deposition techniques. The barrier layer 330 acts as a diffusion barrier to prevent inter-diffusion of a copper metal to be subsequently deposited into the via 314. Preferably, the barrier layer 330 is a thin layer of a refractory metal having a thickness between about 10 Å and about 1000 Å. For example, the barrier layer 330 may include tungsten (W), tantalum (Ta), titanium (Ti), tantalum nitride (TaN), titanium nitride (TiN), or combinations thereof. Preferably, the barrier layer contains tantalum nitride deposited to a thickness of about 20 Å or less using atomic layer deposition or cyclical layer deposition techniques, such as the cyclical layer deposition process shown and described in copending U.S. patent application Ser. No. 10/199,415 filed on Jul. 18, 2002, entitled "Enhanced Copper Growth With Ultrathin Barrier Layer For High Performance Interconnects", which is incorporated by reference herein.

Figure 3C:
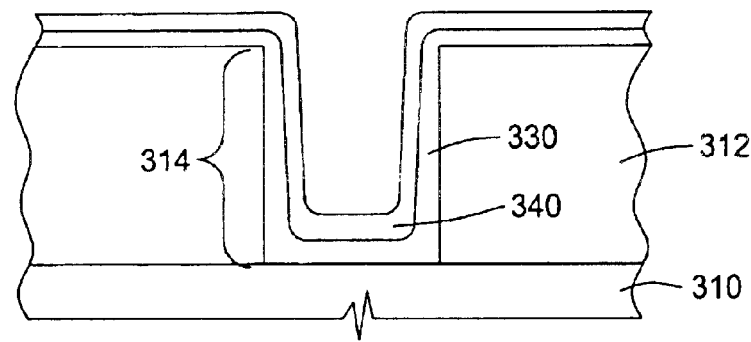

FIG. 3C shows a seed layer 340 at least partially deposited on the barrier layer 330. The seed layer 340 is a copper or a copper alloy material, which may be deposited using physical vapor deposition, chemical vapor deposition, electroless plating, and electroplating techniques. Preferably, the seed layer 340 is deposited using a high density plasma physical vapor deposition (HDP-PVD) process to enable good conformal coverage. One example of a HDP-PVD chamber is the Self-Ionized Plasma SIP™ chamber, available from Applied Materials, Inc. of Santa Clara, Calif.

Figure 3D:
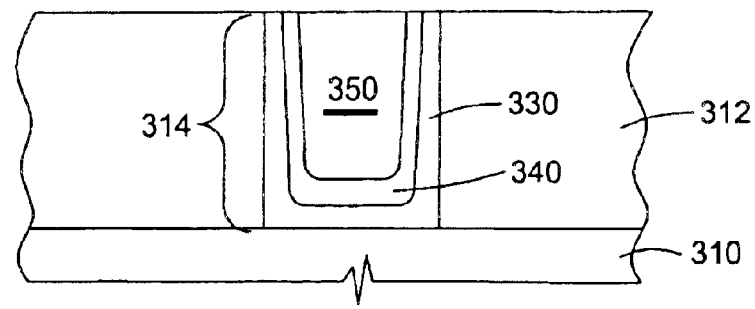

FIG. 3D shows a bulk metal layer 350 at least partially deposited on the seed layer 340. The bulk metal layer 350 is deposited on the seed layer 340 to fill the via 314. The bulk metal layer 350 may be deposited using CVD, PVD, electroplating, or electroless techniques to a thickness between about 1,000 Å and about 2,000 Å. The bulk metal layer 350 may include aluminum, titanium, tungsten, copper, and combinations thereof. Preferably, the bulk metal layer 350 contains copper deposited within an electroplating cell, such as the Electra™ Cu ECP system, available from Applied Materials, Inc., of Santa Clara, Calif.

A copper electrolyte solution and copper electroplating technique is described in commonly assigned U.S. Pat. No. 6,113,771, entitled "Electro-deposition Chemistry", which is incorporated by reference herein. Typically, the electroplating bath has a copper concentration greater than about 0.7M, a copper sulfate concentration of about 0.85, and a pH of about 1.75. The electroplating bath may also contain various additives as is well known in the art. The temperature of the bath is between about 15° C. and about 25° C. The bias is between about −15 volts to about 15 volts. In one aspect, the positive bias ranges from about 0.1 volts to about 10 volts and the negative bias ranges from about −0.1 to about −10 volts.

Optionally, an anneal treatment may be performed following the metal layer 350 deposition whereby the wafer is subjected to a temperature between about 100° C. and about 400° C. for about 10 minutes to about 1 hour, preferably about 30 minutes. A carrier/purge gas such as helium, hydrogen, nitrogen, or a mixture thereof is introduced at a rate of about 100 sccm to about 10,000 sccm. The chamber pressure is maintained between about 2 Torr and about 10 Torr. The RF power is about 200 W to about 1,000 W at a frequency of about 13.56 MHz, and the preferable substrate spacing is between about 300 mils and about 800 mils.

Following the bulk metal layer 350 deposition, the top portion of the structure 300 may be planarized. A chemical mechanical polishing (CMP) apparatus may be used, such as the Mirra™ System available from Applied Materials, Santa Clara, Calif., for example. During the planarization process, portions of the copper 340 and dielectric 312 are removed from the top of the structure 300 leaving a fully planar surface. Optionally, the intermediate surfaces of the structure 300 may be planarized between the deposition of the subsequent layers described above.

Figure 3E:
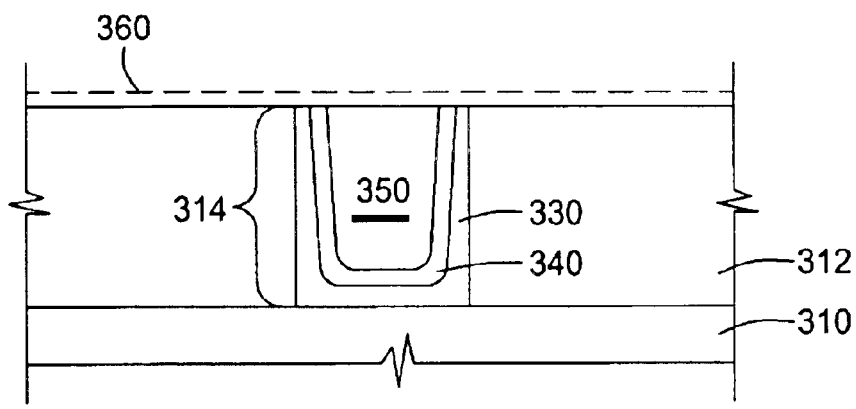

FIG. 3E shows a portion of the substrate surface subjected to a pre-rinse/etch step to remove any unwanted contaminants thereon. The substrate is rinsed or cleaned using an acidic pre-clean solution to remove/etch at least a portion of the substrate surface as indicated by the dashed line 360.

Figure 3F:
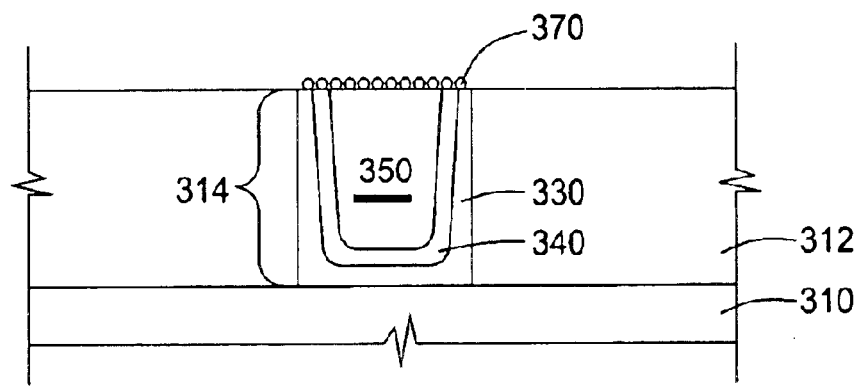

FIG. 3F shows an initiation layer 370 formed over the bulk metal layer 350 as described above in step 120. The initiation layer 370 may be deposited within an electroplating cell, such as the Electra™ Cu ECP system available from Applied Materials, Inc. The initiation layer 370 may also be deposited within the same cell as the bulk metal layer 350.

Figure 3G:
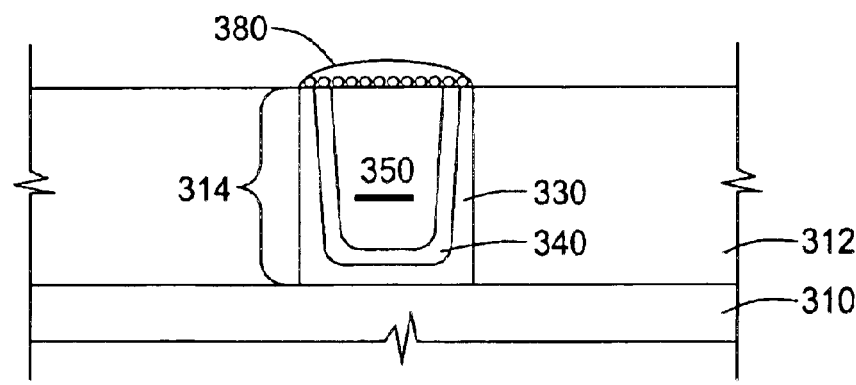

FIG. 3G shows a passivation layer 380 formed over the initiation layer 370 as described above in step 130. The passivation layer 380 may also be deposited within its own designated electroplating cell, such as the Electra™ Cu ECP system. Alternatively, the passivation layer 380 may be deposited within the same cell used to form the initiation layer 370 and/or the bulk metal layer 350. The substrate surface is then exposed to a post-deposition cleaning process as described above in step 140 shown in FIG. 1. The cleaning composition may be applied in-situ or the substrate may be transferred to a different cell prior to cleaning.

EXAMPLES

The following examples describe specific post-rinse processes performed on a 200 mm substrate according to embodiments of the invention. In each example, the 200 mm substrate surface had been prepared as follows.

A patterned or etched wafer formed according to conventional or well-known techniques was introduced into an integrated Endura® processing system available from Applied Materials, Inc. located in Santa Clara, Calif., which included a Pre-Clean II chamber, an IMP PVD Ta/TaN chamber, and a PVD Cu chamber mounted thereon, and was degassed at 350° C. for about 40 seconds. The wafer was first transferred to the Pre-clean II chamber where about 250 Å were removed from the surface of the patterned dielectric. A tantalum barrier layer was then deposited conformally in the via having a thickness of about 250 Å using the IMP PVD Ta/TaN chamber. The wafer was then transferred to the PVD Cu chamber where a 1,000 Å thick conformal seed layer was deposited in the via. Next, the wafer was transferred to an Electra™ Cu ECP system also available from Applied Materials, Inc. located in Santa Clara, Calif., where the via was filled with copper. The wafer was then moved to a chemical mechanical polishing system, such as the Mirra™ system also available from Applied Materials, Inc. located in Santa Clara, Calif., to planarize the upper surface of the wafer.

The wafer was then transferred back to the Electra™ Cu ECP system, where an acidic pre-rinse solution was applied to the substrate surface removing about 25 Å of the top portion of the substrate surface. The pre-rinse solution was a mixture of about 0.5 wt. % of HF acid and 1M nitric acid and was applied at a flow rate of about 750 ml/min for about 60 seconds at a temperature of about 25° C. A rinsing agent (deionized water) was then sprayed onto the substrate surface at a flow rate of about 750 ml/min for about 60 seconds. Next, an initiation layer was deposited on the conductive portions of the substrate surface by applying an electroless solution containing 3 vol % (320 ppm) of palladium chloride and a sufficient amount of HCl to provide a pH of about 1.5 to the substrate surface. A 500 Å thick passivation layer was then deposited on the initiation layer by electroless deposition using a cobalt electroless solution containing 20 g/L of cobalt sulfate, 50 g/L of sodium citrate, 20 g/L of sodium hypophosphite, and a sufficient amount of potassium hydroxide to provide a pH of 10.

Example 1

In this example, a first substrate surface, as prepared above, was exposed to an ultrasonic post-rinse process, which removed about 200 Å of the passivation layer. The post-rinse solution was a mixture of nitric acid and deionized water at a ratio of 1:1 and was applied to the substrate surface at a flow rate of about 750 ml/min for 45 seconds at a temperature of 25° C. and a pressure of 1 atm. The post-rinse process was enhanced by applying ultrasonic energy having a frequency of 100 kHz at 50 Watts for 300 seconds to the substrate support pedestal.

Example 2

In this example, a second substrate surface, as prepared above, was exposed to an ultrasonic post-rinse process, which removed about 200 Å of the passivation layer. The post-rinse solution was a mixture of nitric acid and hydrogen peroxide at a ratio of 2:1 and was applied to the substrate surface at a flow rate of about 750 ml/min for 45 seconds at a temperature of 25° C. and a pressure of 1 atm. The post-rinse process was enhanced by applying ultrasonic energy having a frequency of 100 kHz at 50 Watts for 300 seconds to the substrate support pedestal.

Example 3

In this example, a third substrate surface, as prepared above, was exposed to an ultrasonic post-rinse process, which removed about 200 Å of the passivation layer. The post-rinse solution included a mixture of sulfuric acid and hydrogen peroxide at a ratio of 3:1 and was applied to the substrate surface at a flow rate of about 750 ml/min for 45 seconds at a temperature of 25° C. and a pressure of 1 atm. The post-rinse process was enhanced by applying ultrasonic energy having a frequency of 100 kHz at 50 Watts for 300 seconds to the substrate support pedestal.

Example 4

In this example, a fourth substrate surface, as prepared above, was exposed to an ultrasonic post-rinse process, which removed about 200 Å of the passivation layer. The post-rinse solution included a mixture of hydrochloric acid and hydrogen peroxide at a ratio of 3:1 and was applied to the substrate surface at a flow rate of about 750 ml/min for 45 seconds at a temperature of 25° C. and a pressure of 1 atm. The post-rinse process was enhanced by applying ultrasonic energy having a frequency of 100 kHz at 50 Watts for 300 seconds to the substrate support pedestal.

While the foregoing is directed to the preferred embodiments of the present invention, other and further embodiments of the invention may be devised without departing from the basic scope thereof. The scope of the invention is determined by the claims that follow.

What is claimed is:

1. A method of processing a substrate, comprising:
    selectively depositing an initiation layer on a conductive material by exposing the substrate surface to a first electroless solution consisting essentially of one or more boron based reducing agents;
    depositing a passivating material on the initiation layer by exposing the initiation layer to a second electroless solution; and
    cleaning the substrate surface with an acidic solution.

2. The method of claim 1, wherein the acidic solution comprises a mixture selected from a group consisting of nitric acid and deionized water at a ratio of about 1:2 to about 3:1; nitric acid and hydrogen peroxide at a ratio of about 1:2 to about 3:1; sulfuric acid and hydrogen peroxide at a ratio of about 2:1 to about 4:1; and hydrochloric acid and hydrogen peroxide at a ratio of about 2:1 to about 4:1.

3. The method of claim 1, wherein the substrate surface is exposed to the acidic solution for about 300 seconds or less at a temperature between about 15° C. and about 35° C.

4. The method of claim 1, further comprising applying ultrasonic or megasonic energy to the substrate surface during the application of the acidic solution.

5. The method of claim 1, wherein cleaning the substrate surface with the acidic solution comprises removing at least a portion of the passivating material.

6. The method of claim 1, wherein the acidic solution removes between about 100 Å and about 200 Å of the passivating material.

7. The method of claim 1, wherein the first electroless solution further comprises at least one noble metal salt, such as palladium chloride, palladium sulfate, and palladium ammonium chloride, and at least one inorganic acid, such as hydrochloric acid and hydrofluoric acid.

8. The method of claim 1, wherein the one or more boron-based reducing agents is selected from the group consisting of sodium borohydride, dimethylamine borane, trimethylamine borane, and combinations thereof.

9. The method of claim 1, wherein the passivating material includes cobalt or cobalt alloys selected from the group consisting of cobalt-tungsten alloys, cobalt-phosphorus alloys, cobalt-tin alloys, cobalt-boron alloys, cobalt-tungsten-phosphorus alloys and cobalt-tungsten-boron alloys.

10. A method of processing a substrate, comprising:
    polishing a substrate surface to expose a conductive material disposed in a dielectric material;
    selectively depositing an initiation layer on the conductive material by exposing the substrate surface to a first electroless solution consisting essentially of one or more boron based reducing agents;
    depositing a passivating material on the initiation layer by exposing the initiation layer to a second electroless solution; and
    cleaning the substrate surface with an acidic solution.

11. The method of claim 10, wherein the acidic solution comprises a mixture selected from a group consisting of nitric acid and deionized water at a ratio of about 1:2 to about 3:1; nitric acid and hydrogen peroxide at a ratio of about 1:2 to about 3:1; sulfuric acid and hydrogen peroxide at a ratio of about 2:1 to about 4:1; and hydrochloric acid and hydrogen peroxide at a ratio of about 2:1 to about 4:1.

12. The method of claim 10, further comprising applying ultrasonic or megasonic energy to the substrate surface during the application of the acidic solution.

13. The method of claim 10, wherein the one or more boron-based reducing agents is selected from the group consisting of sodium borohydride, dimethylamine borane, trimethylamine borane, and combinations thereof.

14. The method of claim 10, wherein the conductive material comprises copper and the passivating material comprises cobalt or cobalt alloys selected from the group consisting of cobalt-tungsten alloys, cobalt-phosphorus alloys, cobalt-tin alloys, cobalt-boron alloys, cobalt-tungsten-phosphorus alloys and cobalt-tungsten-boron alloys.

15. A method of processing a substrate, comprising:
   selectively depositing an initiation layer on a conductive material by exposing the substrate surface to a first electroless solution consisting essentially of one or more boron based reducing agents:
   depositing a passivating material on the initiation layer by exposing the initiation layer to a second electroless solution: and
   cleaning the substrate surface with an acidic solution selected from the group consisting of nitric acid and deionized water at a ratio of about 1:2 to about 3:1; nitric acid and hydrogen peroxide at a ratio of about 1:2 to about 3:1; sulfuric acid and hydrogen peroxide at a ratio of about 2:1 to about 4:1; and hydrochloric acid and hydrogen peroxide at a ratio of about 2:1 to about 4:1.

16. The method of claim 15, wherein the conductive layer comprises copper.

17. The method of claim 15, further comprising applying ultrasonic or megasonic energy to the substrate surface during the application of the acidic solution.

18. The method of claim 15, wherein the one or more boron-based reducing agents is selected from the group consisting of sodium borohydride, dimethylamine borane, trimethylamine borane, and combinations thereof.

19. The method of claim 15, wherein the passivating material includes cobalt or cobalt alloys selected from the group consisting of cobalt-tungsten alloys, cobalt-phosphorus alloys, cobalt-tin alloys, cobalt-boron alloys, cobalt-tungsten-phosphorus alloys and cobalt-tungsten-boron alloys.

20. The method of claim 1, further comprising rinsing the substrate surface with a rinsing agent after deposition of the initiation layer and before deposition of the passivating material.

21. The method of claim 10, further comprising rinsing the substrate surface with a rinsing agent after deposition of the initiation layer and before deposition of the passivating material.

22. The method of claim 1, wherein the conductive layer comprises copper.

* * * * *